(12) United States Patent
Choi

(10) Patent No.: US 10,374,077 B2
(45) Date of Patent: Aug. 6, 2019

(54) SEMICONDUCTOR DEVICE HAVING AUXILIARY ELECTRODE FORMED IN FIELD PLATE REGION

(71) Applicant: DONGBU HITEK CO., LTD., Seoul (KR)

(72) Inventor: Yong Keon Choi, Gimpo-si (KR)

(73) Assignee: DB Hitek Co., Ltd, Seoul (KR)

( * ) Notice: Subject to any disclaimer, the term of this patent is extended or adjusted under 35 U.S.C. 154(b) by 0 days.

(21) Appl. No.: 15/709,815

(22) Filed: Sep. 20, 2017

(65) Prior Publication Data

US 2018/0083135 A1 Mar. 22, 2018

(30) Foreign Application Priority Data

Sep. 22, 2016 (KR) .................. 10-2016-0121566

(51) Int. Cl.
| | |
|---|---|
| *H01L 29/06* | (2006.01) |
| *H01L 29/08* | (2006.01) |
| *H01L 29/10* | (2006.01) |
| *H01L 29/40* | (2006.01) |
| *H01L 29/66* | (2006.01) |
| *H01L 29/78* | (2006.01) |
| *H01L 29/423* | (2006.01) |

(52) U.S. Cl.
CPC ........ *H01L 29/7811* (2013.01); *H01L 29/063* (2013.01); *H01L 29/0615* (2013.01); *H01L 29/0653* (2013.01); *H01L 29/0661* (2013.01); *H01L 29/0696* (2013.01); *H01L 29/402* (2013.01); *H01L 29/404* (2013.01); *H01L 29/407* (2013.01); *H01L 29/4238* (2013.01); *H01L 29/66689* (2013.01); *H01L 29/7816* (2013.01); *H01L 29/7823* (2013.01); *H01L 29/0878* (2013.01); *H01L 29/1095* (2013.01); *H01L 29/665* (2013.01)

(58) Field of Classification Search
CPC . H01L 51/56; H01L 51/5072; H01L 51/5056; H01L 33/62; C09K 11/06
USPC ....................................................... 257/328
See application file for complete search history.

(56) References Cited

U.S. PATENT DOCUMENTS

| | | | |
|---|---|---|---|
| 8,664,718 B2 * | 3/2014 | Cheng ................... | H01L 29/402 257/343 |
| 9,000,517 B2 * | 4/2015 | Chu ..................... | H01L 29/7816 257/336 |

(Continued)

*Primary Examiner* — Andy Huynh
(74) *Attorney, Agent, or Firm* — Patterson Thuente Pedersen, P.A.

(57) ABSTRACT

A semiconductor device includes a source region disposed in a substrate and having a first conductivity type, a drain region disposed in the substrate and having the first conductivity type, a first drift region having the first conductivity type and extending in a channel length direction between the source and drain regions, a second drift region having a second conductivity type and extending parallel to the first drift region, a field plate region disposed in an upper portion of the second drift region, an auxiliary electrode disposed in an upper portion of the field plate region, and a gate electrode disposed on the substrate and electrically connected with the auxiliary electrode. Such devices can reduce the specific on-resistance while also reducing electric field concentrations at the edge portions of the gate electrode, and the breakdown voltage of the device can therefore be significantly improved.

19 Claims, 6 Drawing Sheets

(56) References Cited

U.S. PATENT DOCUMENTS

2006/0141714 A1    6/2006   Lee
2011/0115020 A1    5/2011   Cha
2017/0179280 A1*   6/2017   Yadav ............... H01L 29/42376

* cited by examiner

SEMICONDUCTOR DEVICE HAVING AUXILIARY ELECTRODE FORMED IN FIELD PLATE REGION

CROSS-REFERENCE TO RELATED APPLICATION

This application claims the priority benefit of Korean Patent Application No. 10-2016-0121566, filed on Sep. 22, 2016, and all the benefits accruing therefrom under 35 U.S.C. § 119, the contents of which are incorporated by reference in their entirety.

BACKGROUND

The present disclosure relates to a semiconductor device. More particularly, the present disclosure relates to a semiconductor device including a field plate region and an auxiliary electrode formed in the field plate region.

A Metal Oxide Semiconductor Field Effect Transistor (MOSFET) may have relatively high input impedance compared to a bipolar transistor, providing a relatively large power gain and/or a relatively simple gate driving circuit. Further, the MOSFET may be a unipolar device having substantially no-time delay which may result from minority carrier storage and/or recombination while being turned off. The MOSFET may be applied to switching mode power supply devices, lamp ballasts, motor-driving circuits and the like. For example, a DMOSFET (Double Diffused MOSFET) manufactured by using a planar diffusion technology is generally used for each of these technologies.

A lateral double diffused metal oxide semiconductor (LDMOS) device may be applied to a VLSI process due to its relatively simple structure. Particularly, the LDMOS device may have relatively improved electrical characteristics compared to a vertical DMOS (VDMOS) device. For example, Korean Patent No. 10-1128694 discloses a LDMOS device including a field plate for reducing an electric field concentration at an edge portion of a gate electrode and improving a breakdown voltage, and Korean Laid-Open Patent Publication No. 10-2006-0077006 discloses a semiconductor device including a drift region for reducing a specific on-resistance (Rsp).

When the field plate is used, the breakdown voltage can be improved, but the channel length becomes relatively longer and thus the specific on-resistance may be increased. When the drift region is used, the specific on-resistance may be reduced by increasing the impurity concentration of the drift region. However, there is a limit to increase the impurity concentration of the drift region because the breakdown voltage can be lowered as a result to an extent that is unsuitable for some applications.

SUMMARY

The present disclosure provides a semiconductor device capable of improving the breakdown voltage and reducing the specific on-resistance using a super junction structure.

In accordance with an aspect of the present disclosure, a semiconductor device may include a source region disposed in a substrate and having a first conductivity type, a drain region disposed in the substrate and having the first conductivity type, a first drift region having the first conductivity type and extending in a channel length direction between the source and drain regions, a second drift region having a second conductivity type and extending parallel to the first drift region, a field plate region disposed in an upper portion of the second drift region, an auxiliary electrode disposed in an upper portion of the field plate region, and a gate electrode disposed on the substrate and electrically connected with the auxiliary electrode.

In accordance with some exemplary embodiments, the semiconductor device may further include a third drift region connected with the first drift region and having the first conductivity type, and the drain region may be disposed on the third drift region.

In accordance with some exemplary embodiments, the field plate region may extend in the channel length direction, and an end portion of the field plate region may be disposed in the third drift region.

In accordance with some exemplary embodiments, the auxiliary electrode may extend along the field plate region.

In accordance with some exemplary embodiments, the gate electrode may be disposed on a portion of the auxiliary electrode.

In accordance with some exemplary embodiments, the semiconductor device may further include a body region having the second conductivity type, and the source region may be disposed on the body region.

In accordance with some exemplary embodiments, the second drift region may be connected with the body region, and the first drift region may be spaced apart from the body region.

In accordance with some exemplary embodiments, the semiconductor device may further include a first well region having the first conductivity type and a second well region having the second conductivity type and disposed in the first well region, and the first and second drift regions may be disposed on the second well region.

In accordance with some exemplary embodiments, the semiconductor device may further include a silicide blocking layer disposed on the first drift region and the auxiliary electrode.

In accordance with another aspect of the present disclosure, a semiconductor device may include a first well region disposed in a substrate and having a first conductivity type, a second well region disposed in the first well region and having a second conductivity type, a body region disposed on the second well region and having the second conductivity type, a super junction region disposed on the second well region to be adjacent to the body region and comprising first drift regions having the first conductivity type and second drift regions having the second conductivity type, a third drift region connected with the first drift regions and having the first conductivity type, field plate regions disposed in upper portions of the second drift regions, auxiliary electrodes disposed in upper portions of the field plate regions, a source region disposed in an upper portion of the body region and having the first conductivity type, a drain region disposed in an upper portion of the third drift region and having the first conductivity type, and a gate electrode disposed on the substrate and electrically connected with the auxiliary electrode.

In accordance with some exemplary embodiments, the first and second drift regions may extend in a channel length direction between the source and drain regions and may be alternately disposed in a channel width direction perpendicular to the channel length direction.

In accordance with some exemplary embodiments, the field plate regions and the auxiliary electrodes may extend along the second drift regions.

In accordance with some exemplary embodiments, each of the auxiliary electrodes may include a first extending portion connected to the gate electrode and having a first width, and a second extending portion extending from the first extending portion toward the drain region and having a second width smaller than the first width.

In accordance with some exemplary embodiments, each of the auxiliary electrodes may have a width gradually decreasing from the gate electrode toward the drain region.

In accordance with some exemplary embodiments, the semiconductor device may further include a silicide blocking layer disposed on the first drift regions and the auxiliary electrodes.

In accordance with some exemplary embodiments, the auxiliary electrodes may be electrically isolated from the first drift regions by the field plate regions.

In accordance with some exemplary embodiments, side surfaces of the field plate regions may be in contact with the first drift regions.

In accordance with some exemplary embodiments, the first drift regions may be spaced apart from the body region, and the second drift regions may be in contact with the body region.

In accordance with some exemplary embodiments, the third drift region may be disposed on the first well region.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

Figure 1:
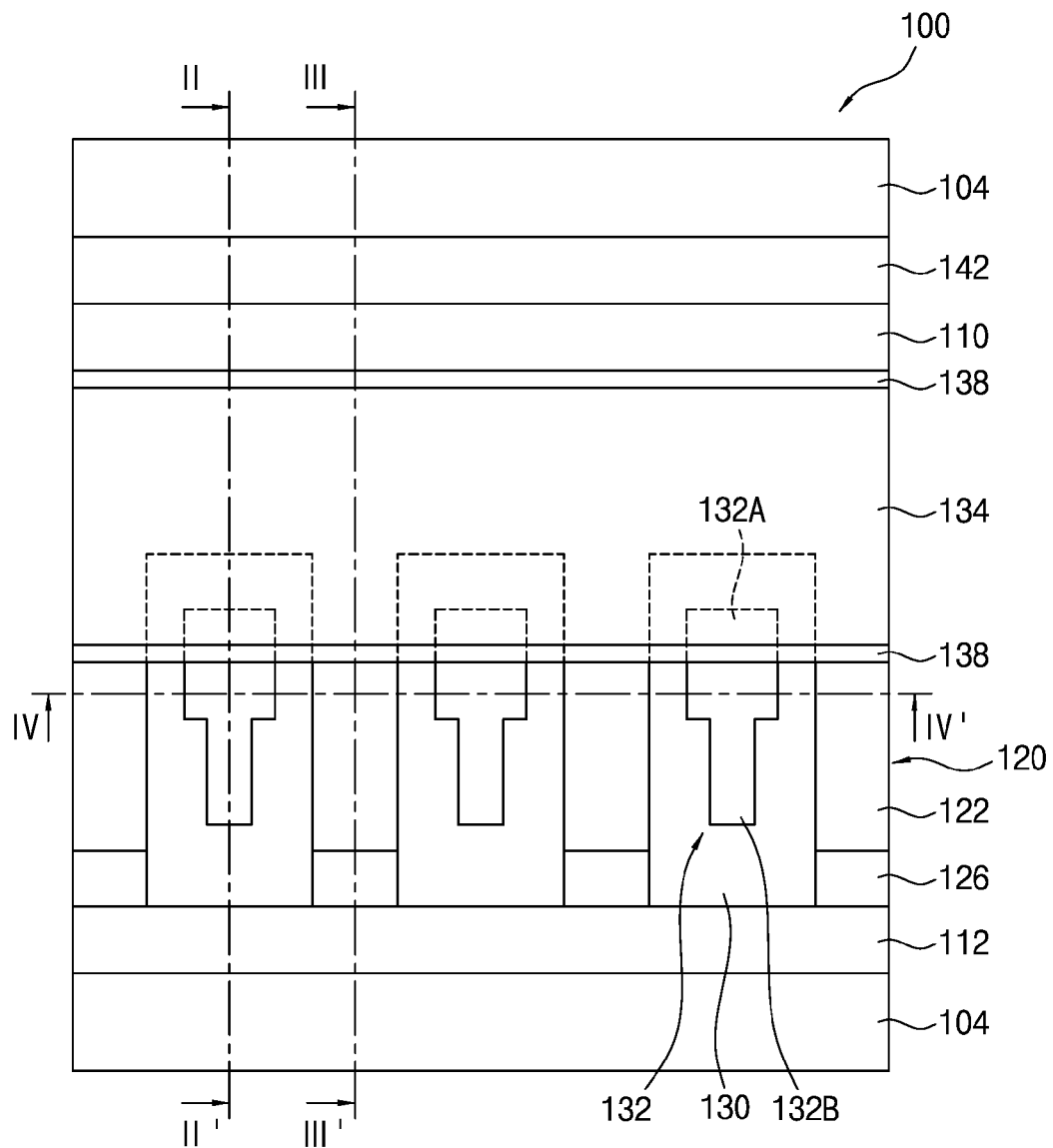
FIG. 1 is a plan view illustrating a semiconductor device in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present disclosure, the regions and the layers are not limited to these terms.

Terminologies used below are used to merely describe specific embodiments, but do not limit the present disclosure. Additionally, unless otherwise defined here, all the terms including technical or scientific terms, may have the same meaning that is generally understood by those skilled in the art.

Embodiments of the present disclosure are described with reference to schematic drawings of ideal embodiments. Accordingly, changes in manufacturing methods and/or allowable errors may be expected from the forms of the drawings. Accordingly, embodiments of the present disclosure are not described being limited to the specific forms or areas in the drawings, and include the deviations of the forms. The areas may be entirely schematic, and their forms may not describe or depict accurate forms or structures in any given area, and are not intended to limit the scope of the present disclosure.

FIG. 1 is a plan view illustrating a semiconductor device in accordance with an exemplary embodiment of the present disclosure.

Figure 4:
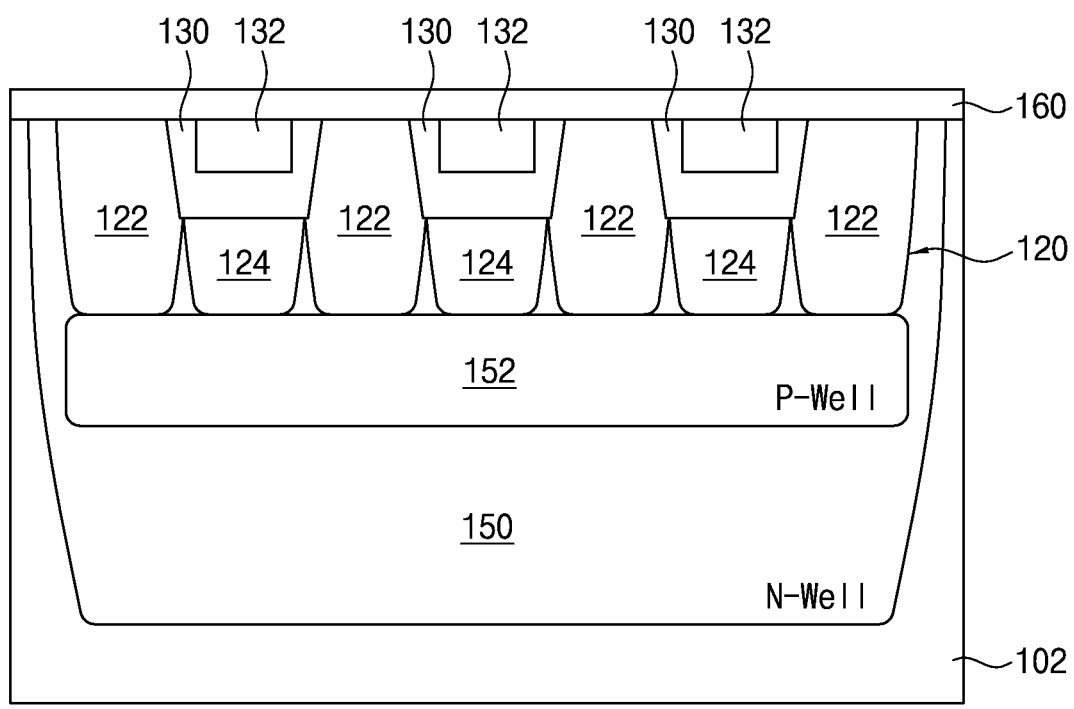
FIG. 4 is a cross-sectional view taken along a line IV-IV' as shown in FIG. 1.

Referring to FIG. 1, a semiconductor device 100, in accordance with an exemplary embodiment of the present disclosure, may improve the breakdown voltage and reduce the specific on-resistance using a super junction structure including N-type first drift regions 122 (as depicted in FIG. 4) and P-type second drift regions 124 (as depicted in FIG. 4)

Figure 2:
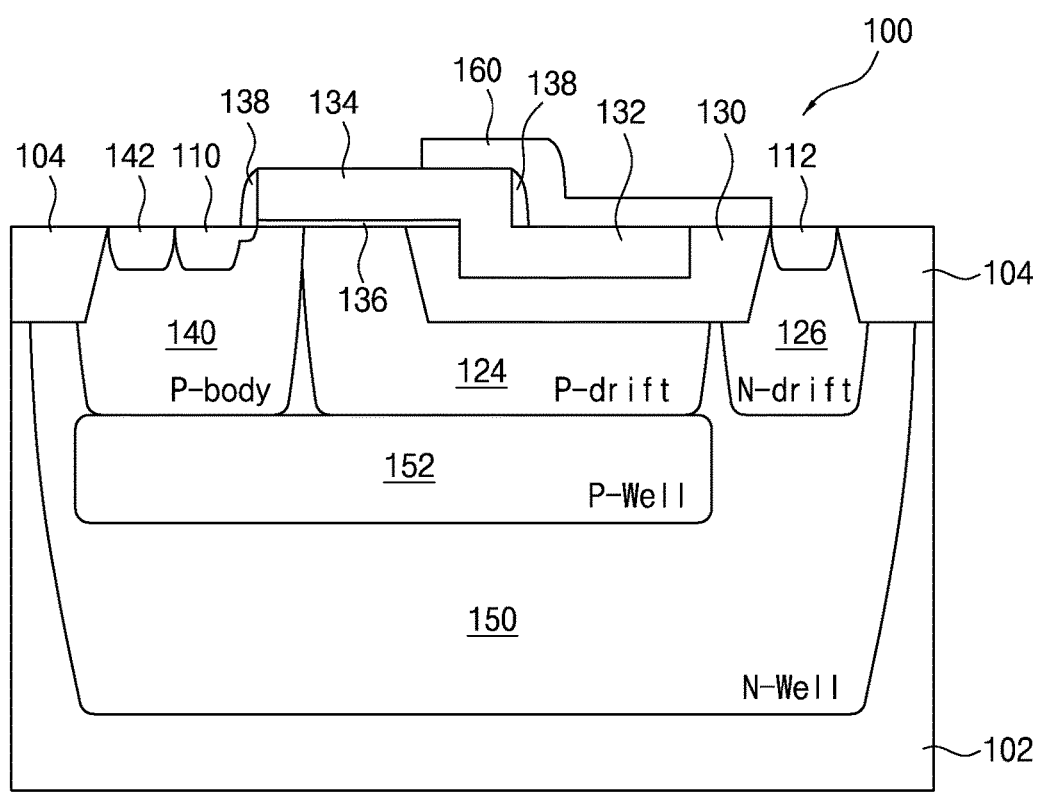
FIG. 2 is a cross-sectional view taken along a line II-II' as shown in FIG. 1.

The semiconductor device 100 may include a source region 110 and a drain region 112 disposed in a substrate 102 (as depicted in FIG. 2), and a super junction region 120 disposed between the source region 110 and the drain region 112. Particularly, source and drain regions 110 and 112 having a first conductivity type may be formed in upper surface portions of the substrate 102 to be spaced apart from each other, and a super junction region 120 including first drift region(s) 122 having the first conductivity type and second drift region(s) 124 having a second conductivity type may be formed between the source region 110 and the drain region 112.

For example, N-type high concentration impurity regions may be used as the source and drain regions 110 and 112, and the super junction region 120 may include N-type first drift regions 122 and P-type second drift regions 124. The substrate 102 may have the second conductivity type. For example, a P-type substrate may be used as the substrate 102.

The semiconductor device 100 may include field plate region(s) 130 disposed in upper portion(s) of the super junction region 120, auxiliary electrode(s) 132 disposed in upper portion(s) of the field plate region(s) 130, and a gate electrode 134 disposed on the substrate 102 to be electrically connected with the auxiliary electrode(s) 132. Particularly, the field plate region(s) 130 may be disposed in upper portion (s) of the second drift region(s) 124.

Figure 3:
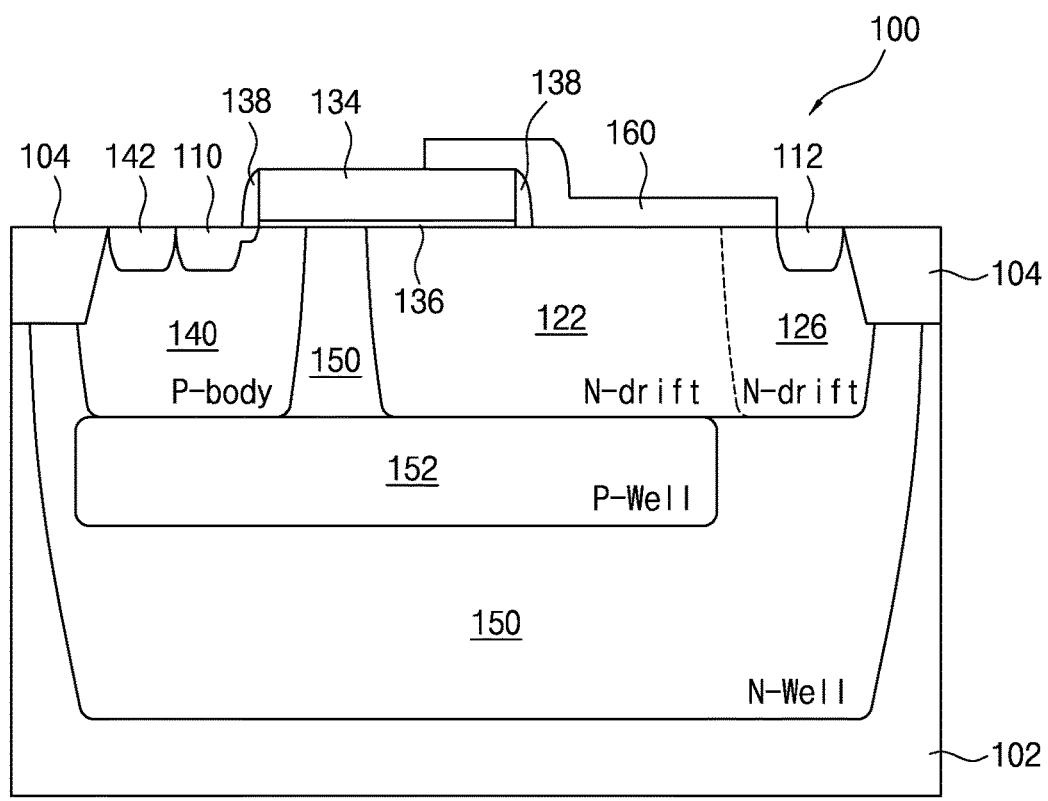
FIG. 3 is a cross-sectional view taken along a line III-III' as shown in FIG. 1.

FIG. 2 is a cross-sectional view taken along a line II-II' as shown in FIG. 1, FIG. 3 is a cross-sectional view taken along a line III-III' as shown in FIG. 1, and FIG. 4 is a cross-sectional view taken along a line IV-IV' as shown in FIG. 1.

Referring to FIGS. 1 to 4, the semiconductor device 100 may be formed in an active region defined by device isolation regions 104. For example, the device isolation regions 104 may be formed by a shallow trench isolation (STI) process.

The semiconductor device 100 may include a source region 110 and a drain region 112 each having a first conductivity type and formed in upper surface portions of the substrate 102 (i.e., in upper surface portions of the active region to be spaced apart from each other). For example, an N-type source region 110 and an N-type drain region may be used. Further, the semiconductor device 100 may include a super junction region 120 disposed between the source and drain regions 110 and 112, which includes first drift regions 122 having the first conductivity type and second drift regions 124 having the second conductivity type.

Figure 5:
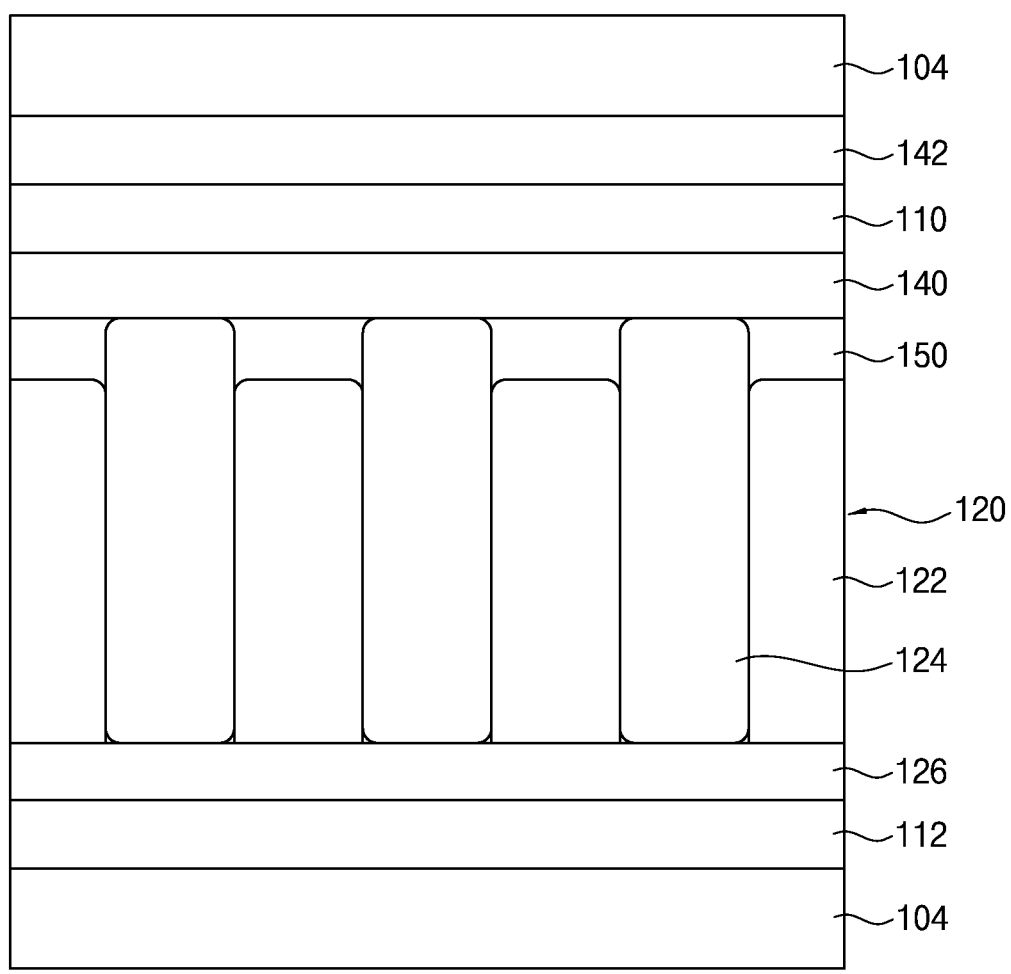
FIG. 5 is a schematic view illustrating first drift regions and second drift regions.

FIG. 5 is a schematic view illustrating the first drift regions 122 and the second drift regions 124 formed in upper portions of the substrate 102.

Figure 6:
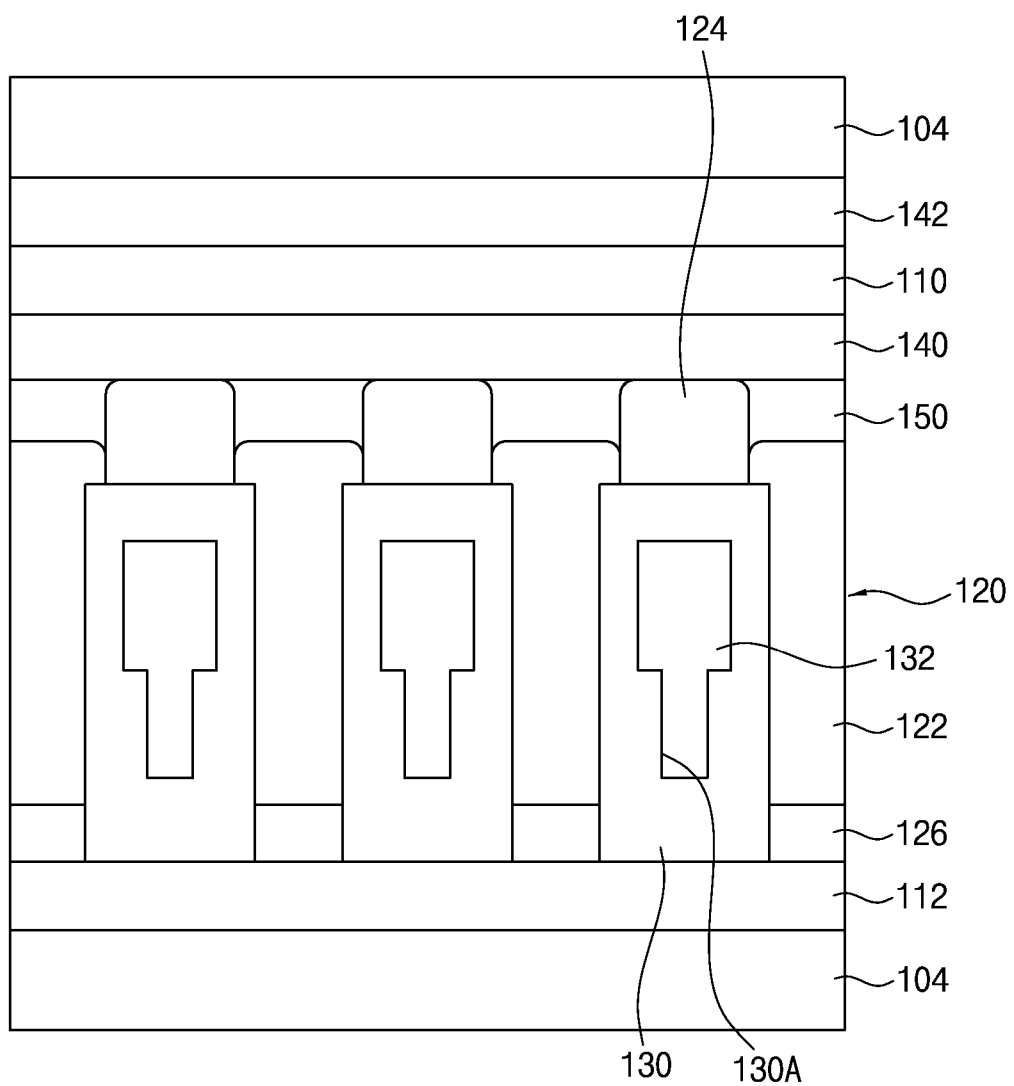
FIG. 6 is a schematic view illustrating a method of forming field plate regions and auxiliary electrodes.

Referring to FIG. 5, the super junction region 120 may include N-type first drift regions 122 and P-type second drift regions 124. The first and second drift regions 122 and 124 may extend in a channel length direction from the source region 110 toward the drain region 112 as shown in FIGS. 2, 3 and 6, and may alternately disposed in a channel width direction perpendicular to the channel length direction as shown in FIGS. 4 and 5.

The first and second drift regions 122 and 124 may be formed by an ion implantation process, and impurity concentrations of the first and second drift regions 122 and 124 may be appropriately adjusted such that the super junction region 120 is fully depleted when the semiconductor device 100 is in an off state.

As described above, when the first and second drift regions 122 and 124 are fully depleted in the off state, the breakdown voltage of the semiconductor device 100 may be significantly improved. Further, because the second drift regions 124 are disposed among the first drift regions 122, the impurity concentration of the first drift regions 122 may be adjusted to be relatively high thereby significantly reducing the specific on-resistance of the semiconductor device 100.

The semiconductor device 100 may include a third drift region 126 having the first conductivity type and a body region 140 having the second conductivity type. The third drift region 126 may be connected with the first drift regions 122, and the drain region 112 may be formed in an upper portion of the third drift region 126. For example, the third drift region 126 may be formed by an ion implantation process, and the drain region 112 may then be formed at an upper surface portion of the third drift region 126. Further, the third drift region 126 may be simultaneously formed with the first drift regions 122 and may have the same impurity concentration as the first drift regions 122. The drain region 112 may have an impurity concentration higher than that of the third drift region 126.

Alternatively, the first drift regions 122 may be formed separately from the third drift region 126. In such case, the third drift region 126 may have an impurity concentration higher than that of the first drift regions 122, and the drain region 112 may have an impurity concentration higher than that of the third drift region 126.

The body region 140 may be a P-type impurity region formed by an ion implantation process, and the N-type source region 110 may be formed in an upper portion of the body region 140. Further, a P-type tap region 142 may be formed in an upper portion of the body region 140 to be adjacent to the source region 110.

In accordance with an exemplary embodiment of the present disclosure, the second drift regions 124 may be in contact with the body region 140 as shown in FIG. 2, and the first drift regions 122 may be spaced apart from the body region 140 as shown in FIG. 3. Particularly, portions of a first well region 150 may be disposed between the first drift regions 122 and the body region 140.

For example, a first well region 150 having the first conductivity type may be formed in the substrate 102, and a second well region 152 (as shown in FIGS. 2 and 3) having the second conductivity type may be formed in the first well region 150. In detail, an N-type well region 150 may be formed in the substrate 102 by an ion implantation process, and a P-type well region 152 may then be formed in the N-type well region 150 by an ion implantation process.

Particularly, the body region 140 and the first and second drift regions 122 and 124 may be formed on the second well region 152 as shown in FIGS. 2 and 3. That is, the body region 140 and the first and second drift regions 122 and 124 may be formed at upper portions of the first well region 150, and thus portions of the first well region 150 may be disposed between the first drift regions 122 and the body region 140.

The first well region 150 may have an impurity concentration lower than that of the first drift regions 122. As a result, an N-type impurity concentration may be increased from the body region 140 toward the drain region 112 thereby improving the electron mobility of the semiconductor device 100.

The third drift region 126 may be formed at an upper portion of the first well region 150 and may be in contact with the first drift regions 122 as shown in FIGS. 2 and 3.

FIG. 6 is a schematic view illustrating a method of forming the field plate regions 130 and the auxiliary electrodes 132 as shown in FIG. 1.

Referring to FIG. 6, the field plate regions 130 may extend parallel to the first drift regions 122. Thus, the field plate regions 130 may also extend on the second drift regions 124 in the channel length direction, as described in more detail above. For example, first end portions of the field plate regions 130 may be disposed in the third drift region 126, and the drain region 112 may be disposed to be in contact with the first end portions of the field plate regions 130 as shown in FIG. 2. Second end portions of the field plate regions 130 may be disposed to be spaced apart from the body region 140.

For example, the field plate regions 130 may have a STI structure and may be simultaneously formed with the device isolation regions 104. The auxiliary electrodes 132 may be formed in upper portions of the field plate regions 130, respectively, and may extend along the field plate regions 130. The auxiliary electrodes 130 may be electrically isolated from the first, second and third drift regions 122, 124 and 126 by the field plate regions 130. The auxiliary electrodes 132 may be formed by forming trenches 130A at upper portions of the field plate regions 130, respectively, and filling up the trenches 130A with a conductive material, for example, an impurity doped polysilicon.

The auxiliary electrodes 132 may be used to generate an electric field in the first drift regions 122. Particularly, side surfaces of the field plate regions 130 may be in contact with the first drift regions 122, and an electric field may be generated in the first drift regions 122 by the auxiliary electrodes 132 in an on state of the semiconductor device 100. As a result, the electric field concentration at edge portions of the gate electrode 134 may be significantly reduced by the auxiliary electrodes 132 thereby improving the breakdown voltage of the semiconductor device 100.

The gate electrode 134 may extend in the channel width direction and may be disposed on end portions of the auxiliary electrodes 132. In detail, the gate electrode 134 may be disposed on a portion of the body portion 140, portions of the first and second drift regions 122 and 124, portions of the field plate regions 130, and end portions of the auxiliary electrodes 132.

The gate electrode 134 may include the same material as the auxiliary electrodes 132 and may be simultaneously formed with the auxiliary electrodes 132. For example, after forming the trenches 130A, a conductive material layer (not shown) may be formed on the substrate 102 such that the trenches 130A are filled with a conductive material. Then, the gate electrode 134 and the auxiliary electrodes 132 may be simultaneously formed by patterning the conductive material layer.

Meanwhile, a gate insulating layer 136 may be disposed between the gate electrode 134 and the substrate 102, and gate spacers 138 may be disposed on side surfaces of the gate electrode 134.

In accordance with an exemplary embodiment, widths of the auxiliary electrodes 132 may be appropriately determined to adjust the electric field in the first drift regions 122 to a predetermined level. For example, each of the auxiliary electrodes 132 may include a first extending portion 132A connected to the gate electrode 134 and having a first width, and a second extending portion 132B extending from the first extending portion 132A toward the drain region 112 and having a second width smaller than the first width. Alternatively, each of the auxiliary electrodes 132 may have a width gradually decreasing from the gate electrode 134 toward the drain region 112.

The source region 110, the drain region 112 and the gate electrode 134 may be connected with metal or other conductive wirings (not shown) that are subsequently formed on the substrate 102. Here, metal silicide patterns may be formed on the source region 110, the drain region 112 and the gate electrode 134 in order to reduce the electrical resistance. In accordance with an exemplary embodiment, though not shown in FIG. 1, the semiconductor device 100 may include a silicide blocking layer to prevent metal silicide from being formed on the first drift regions 122 and auxiliary electrodes 132 as shown in FIGS. 2, 3 and 4. For example, the silicide blocking layer may include silicon oxide or silicon nitride and may be formed on a portion of the gate electrode 134, the auxiliary electrodes 132 and the first drift regions 122.

In accordance with the exemplary embodiments of the present disclosure as described above, when the semiconductor device 100 is in the off state, the first and second drift regions 122 and 124 may be fully depleted thereby improving the breakdown voltage of the semiconductor device 100. Further, the first drift regions 122 may have an impurity concentration higher than the conventional devices and the specific on-resistance of the semiconductor device 100 may thus be significantly reduced. Still further, the electric field concentration at the edge portions of the gate electrode 134 may be reduced by the auxiliary electrodes 132 and the breakdown voltage of the semiconductor device 100 may thus be significantly improved, thus obviating the deficiencies of conventional systems.

Although the semiconductor device 100 has been described with reference to specific embodiments, it is not limited thereto. Therefore, it will be readily understood by those skilled in the art that various modifications and changes can be made thereto without departing from the spirit and scope of the present disclosure defined by the appended claims.

The invention claimed is:

1. A semiconductor device comprising:
   a source region disposed in a substrate and having a first conductivity type;
   a drain region disposed in the substrate and having the first conductivity type;
   a first drift region having the first conductivity type and extending primarily in a channel length direction between the source and drain regions;
   a second drift region having a second conductivity type that is different from the first conductivity type, the second drift region extending primarily parallel to the first drift region, the second drift region defining an upper portion;
   a field plate region disposed in the upper portion of the second drift region and the field plate also defining an upper portion;
   an auxiliary electrode disposed in the upper portion of the field plate region; and
   a gate electrode disposed on the substrate and electrically connected to the auxiliary electrode.

2. The semiconductor device of claim 1, further comprising a third drift region electrically connected with the first drift region and having the first conductivity type, wherein the drain region is disposed on the third drift region.

3. The semiconductor device of claim 2, wherein the field plate region extends in the channel length direction, and an end portion of the field plate region is disposed in the third drift region.

4. The semiconductor device of claim 3, wherein the auxiliary electrode extends adjacent to and parallel the field plate region.

5. The semiconductor device of claim 4, wherein the gate electrode is disposed directly on a portion of the auxiliary electrode.

6. The semiconductor device of claim 1, further comprising a body region having the second conductivity type, wherein the source region is disposed on the body region.

7. The semiconductor device of claim 6, wherein the second drift region is connected with the body region, and the first drift region is spaced apart from the body region.

8. The semiconductor device of claim 1, further comprising:
   a first well region having the first conductivity type; and
   a second well region having the second conductivity type and disposed in the first well region,
   wherein the first and second drift regions are disposed on the second well region.

9. The semiconductor device of claim 1, further comprising a silicide blocking layer disposed on the first drift region and the auxiliary electrode.

10. A semiconductor device comprising:
    a first well region disposed in a substrate and having a first conductivity type;
    a second well region disposed in the first well region and having a second conductivity type that is different from the first conductivity type;
    a body region disposed on the second well region and having the second conductivity type;
    a super junction region disposed on the second well region to be adjacent to the body region and comprising a plurality of first drift regions each having the first conductivity type and a plurality of second drift regions each having the second conductivity type;

a third drift region connected with the first drift regions and having the first conductivity type;

a plurality of field plate regions disposed in upper portions of the second drift regions;

a plurality of auxiliary electrodes each disposed in an upper portion of a corresponding one of the plurality of field plate regions;

a source region disposed in an upper portion of the body region and having the first conductivity type;

a drain region disposed in an upper portion of the third drift region and having the first conductivity type; and a gate electrode disposed on the substrate and electrically connected with the auxiliary electrode.

11. The semiconductor device of claim 10, wherein the first and second drift regions extend in a channel length direction between the source and drain regions and are alternately disposed primarily in a channel width direction perpendicular to the channel length direction.

12. The semiconductor device of claim 11, wherein the field plate regions and the auxiliary electrodes extend along the second drift regions.

13. The semiconductor device of claim 12, wherein each of the auxiliary electrodes comprises:

a first extending portion connected to the gate electrode and having a first width; and a second extending portion extending from the first extending portion toward the drain region and having a second width smaller than the first width.

14. The semiconductor device of claim 12, wherein each of the auxiliary electrodes has a width gradually decreasing from the gate electrode toward the drain region.

15. The semiconductor device of claim 11, further comprising a silicide blocking layer disposed on the first drift regions and the auxiliary electrodes.

16. The semiconductor device of claim 10, wherein the auxiliary electrodes are electrically isolated from the first drift regions by the field plate regions.

17. The semiconductor device of claim 16, wherein side surfaces of the field plate regions are arranged to be in contact with the first drift regions.

18. The semiconductor device of claim 10, wherein the first drift regions are spaced apart from the body region and the second drift regions are arranged to be in contact with the body region.

19. The semiconductor device of claim 10, wherein the third drift region is disposed on the first well region.

* * * * *